US010249625B1

(12) United States Patent
Herko et al.

(10) Patent No.: US 10,249,625 B1
(45) Date of Patent: *Apr. 2, 2019

(54) COATED PRINTED ELECTRONIC DEVICES EXHIBITING IMPROVED YIELD

(71) Applicant: Xerox Corporation, Norwalk, CT (US)

(72) Inventors: Jonathan H. Herko, Walworth, NY (US); Michael S. Roetker, Webster, NY (US); Kyle B. Tallman, Perry, NY (US); Eric Robert Dudek, Webster, NY (US); Amy Catherine Porter, Rochester, NY (US); David M. Skinner, Rochester, NY (US); Lin Ma, Pittsford, NY (US); Markus R. Silvestri, Fairport, NY (US)

(73) Assignee: XEROX CORPORATION, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/038,427

(22) Filed: Jul. 18, 2018

(51) Int. Cl.
*H01L 27/10* (2006.01)
*H01L 23/00* (2006.01)
(Continued)

(52) U.S. Cl.
CPC ...... *H01L 27/101* (2013.01); *H01L 21/02288* (2013.01); *H01L 21/288* (2013.01);
(Continued)

(58) Field of Classification Search
CPC combination set(s) only.
See application file for complete search history.

(56) References Cited

U.S. PATENT DOCUMENTS 3,720,862 A * 3/1973 Mason ............... C03C 3/074
361/320
4,713,157 A * 12/1987 McMillan ............ C23C 14/06
204/192.11
(Continued)

FOREIGN PATENT DOCUMENTS

| WO | WO2006135245 | 12/2006 |
| WO | WO2006135246 | 12/2006 |
| WO | WO2006135247 | 12/2006 |

*Primary Examiner* — William H. Mayo, III
*Assistant Examiner* — Krystal Robinson
(74) *Attorney, Agent, or Firm* — Bell & Manning, LLC

(57) ABSTRACT

A coated, printed electronic device may comprise a plurality of contact pads arranged in a pattern, a plurality of electrode traces arranged in another pattern, the plurality of electrode traces comprising a set of bottom electrode traces and a set of top electrode traces, each electrode trace in electrical communication with an associated contact pad of the plurality of contact pads, a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers, and a protective layer covering the plurality of electrode traces and extending laterally beyond each edge of each electrode trace to provide a buffer zone surrounding each electrode trace, the buffer zone extending from an end of each electrode trace to cover a portion of each associated contact pad in an overlapping region, wherein each contact pad also has at least one uncovered edge.

18 Claims, 7 Drawing Sheets

(51) Int. Cl.
  *H01L 49/02* (2006.01)
  *H01L 23/528* (2006.01)
  *H01L 21/02* (2006.01)
  *H01L 21/288* (2006.01)
  *H05K 3/12* (2006.01)
  *H05K 1/11* (2006.01)
  *H05K 3/40* (2006.01)
  *H05K 1/16* (2006.01)
  *H05K 1/02* (2006.01)

(52) U.S. Cl.
  CPC ............ *H01L 23/528* (2013.01); *H01L 24/06* (2013.01); *H01L 28/60* (2013.01); *H05K 1/02* (2013.01); *H05K 1/111* (2013.01); *H05K 1/162* (2013.01); *H05K 3/12* (2013.01); *H05K 3/4007* (2013.01); *H01L 27/10* (2013.01); *H01L 2224/06131* (2013.01); *H01L 2924/0002* (2013.01); *H05K 2201/09227* (2013.01); *H05K 2201/09409* (2013.01); *H05K 2201/10159* (2013.01)

(56) References Cited

U.S. PATENT DOCUMENTS

| | | | |
|---|---|---|---|
| 5,214,300 A * | 5/1993 | Rohrer | C23C 14/06 257/295 |
| 7,374,954 B2 * | 5/2008 | Kang | G11C 11/22 438/240 |
| 9,412,705 B2 | 8/2016 | Karlsson et al. | |
| 2007/0049155 A1 | 3/2007 | Moro et al. | |
| 2007/0138520 A1 * | 6/2007 | Leenders | H01L 27/101 257/295 |

* cited by examiner

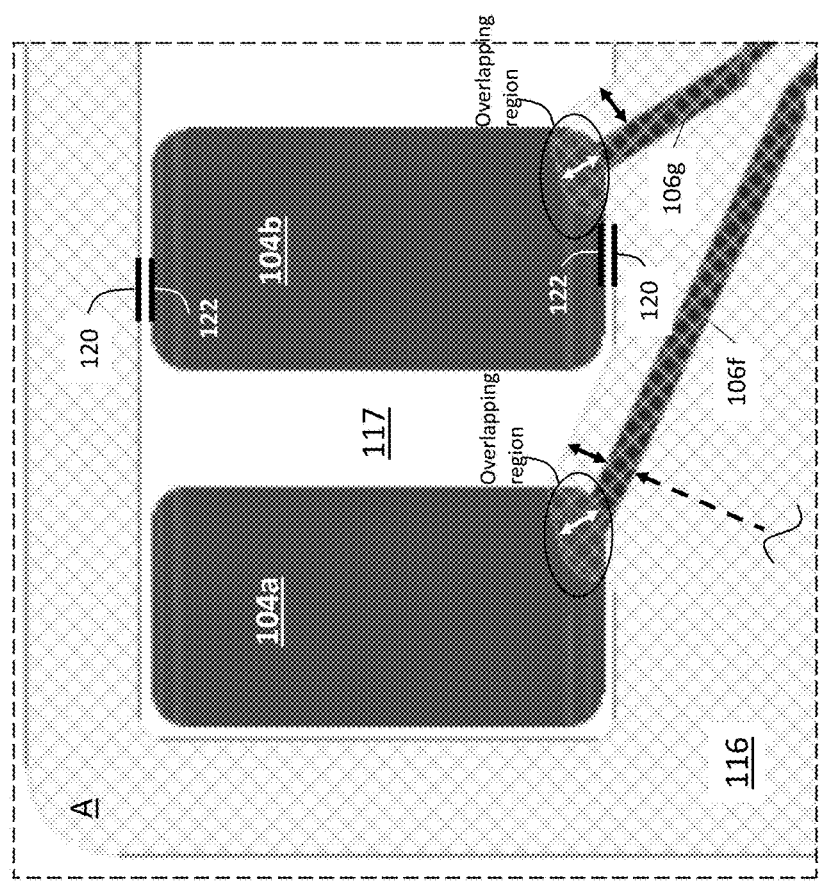

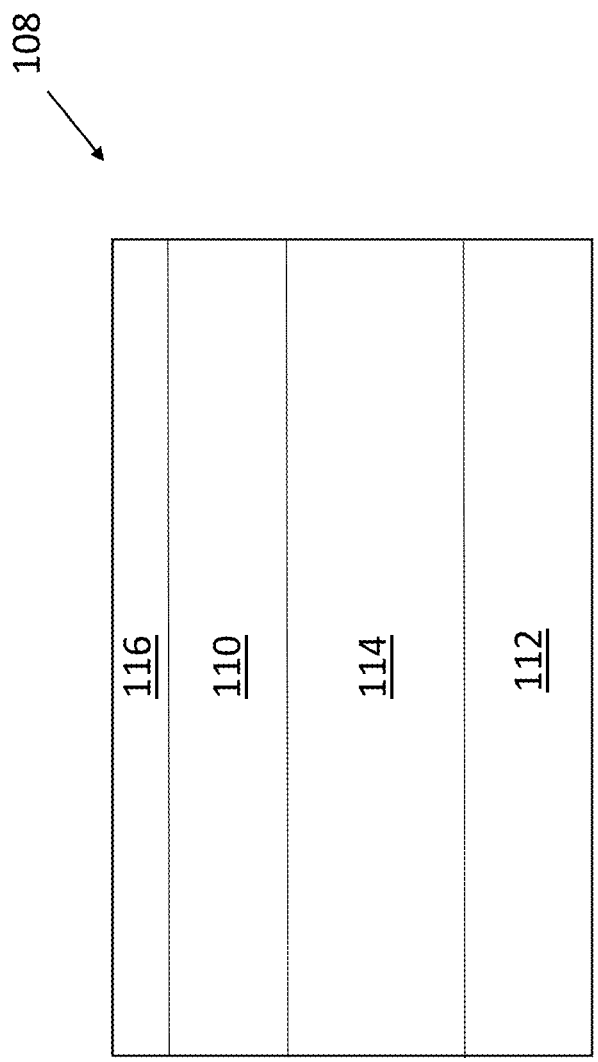

COATED PRINTED ELECTRONIC DEVICES EXHIBITING IMPROVED YIELD

BACKGROUND

Printed electronics based on memory cells are used in a wide variety of applications, including as labels, tags and sensors. The memory cells are capacitor-like structures, each structure including a layer of a memory material sandwiched between a pair of electrode layers. The memory cells may be accessed via conductive traces linking the electrodes to an electronic driver and detection circuitry which may be located on the periphery of the memory cells or in a separate module, e.g., a read/write unit. Depending upon the application, the printed electronic device may contain a few or up to several million memory cells. Regardless of the particular configuration of the printed electronic device, the yield of the device is generally maximized in order for the device to operate as intended (e.g., to allow for accurate and efficient reading of, and writing to, the individual memory cells). Unfortunately, despite the advantages of the various printing methods (e.g., inkjet printing, screen printing, gravure printing, etc.) used to fabricate printed electronic devices, many factors in the fabrication process can contribute to reduced yield of the devices.

SUMMARY

Provided are coated printed electronic devices exhibiting improved yield and methods of fabricating and using such devices.

In embodiments coated, printed electronic devices are provided which comprise a plurality of contact pads arranged in a pattern, a plurality of electrode traces arranged in another pattern, the plurality of electrode traces comprising a set of bottom electrode traces and a set of top electrode traces, each electrode trace in electrical communication with an associated contact pad of the plurality of contact pads, a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers, and a protective layer covering the plurality of electrode traces and extending laterally beyond each edge of each electrode trace to provide a buffer zone surrounding each electrode trace, the buffer zone extending from an end of each electrode trace to cover a portion of each associated contact pad in an overlapping region, wherein each contact pad also has at least one uncovered edge.

In embodiments, methods of fabricating coated, printed electronic devices are provided which comprise printing a plurality of bottom electrode traces on a substrate; printing a layer of a ferroelectric material on the plurality of bottom electrode traces; printing a plurality of top electrode traces on the layer of the ferroelectric material, wherein the plurality of bottom and top electrode traces forms a plurality of electrode traces arranged in a pattern and defines a plurality of memory cells, each memory cell located at an intersection of a pair of electrode traces of the plurality of electrode traces; printing a plurality of contact pads on the plurality of electrode traces, wherein the plurality of contact pads is arranged in another pattern and each electrode trace of the plurality of electrode traces is in electrical communication with an associated contact pad of the plurality of contact pads; printing a curable composition on the plurality of electrode traces and the plurality of contact pads; and curing the curable composition to form a protective layer. The protective layer covers the plurality of electrode traces and extends laterally beyond each edge of each electrode trace to provide a buffer zone surrounding each electrode trace, the buffer zone extending from an end of each electrode trace to cover a portion of each associated contact pad in an overlapping region, wherein each contact pad also has at least one uncovered edge.

In embodiments, methods of using coated, printed electronic devices are provided which comprise contacting a plurality of contact pads of a coated, printed electronic device with a plurality of pins of a read/write unit, the device comprising the plurality of contact pads arranged in a pattern, a plurality of electrode traces arranged in another pattern, the plurality of electrode traces comprising a set of bottom electrode traces and a set of top electrode traces, each electrode trace in electrical communication with an associated contact pad of the plurality of contact pads, a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers, and a protective layer covering the plurality of electrode traces and extending laterally beyond each edge of each electrode trace to provide a buffer zone surrounding each electrode trace, the buffer zone extending from an end of each electrode trace to cover a portion of each associated contact pad in an overlapping region, wherein each contact pad also has at least one uncovered edge.

These and other aspects will be discussed in greater detail below.

BRIEF DESCRIPTION OF THE DRAWINGS

Illustrative embodiments will hereafter be described with reference to the accompanying drawings.

FIG. 1B depicts an expanded view of section A of the coated printed electronic device of FIG. 1A. FIG. 1C depicts a cross-sectional view of a memory cell of the coated printed electronic device of FIG. 1A.

DETAILED DESCRIPTION

Figure 1A:
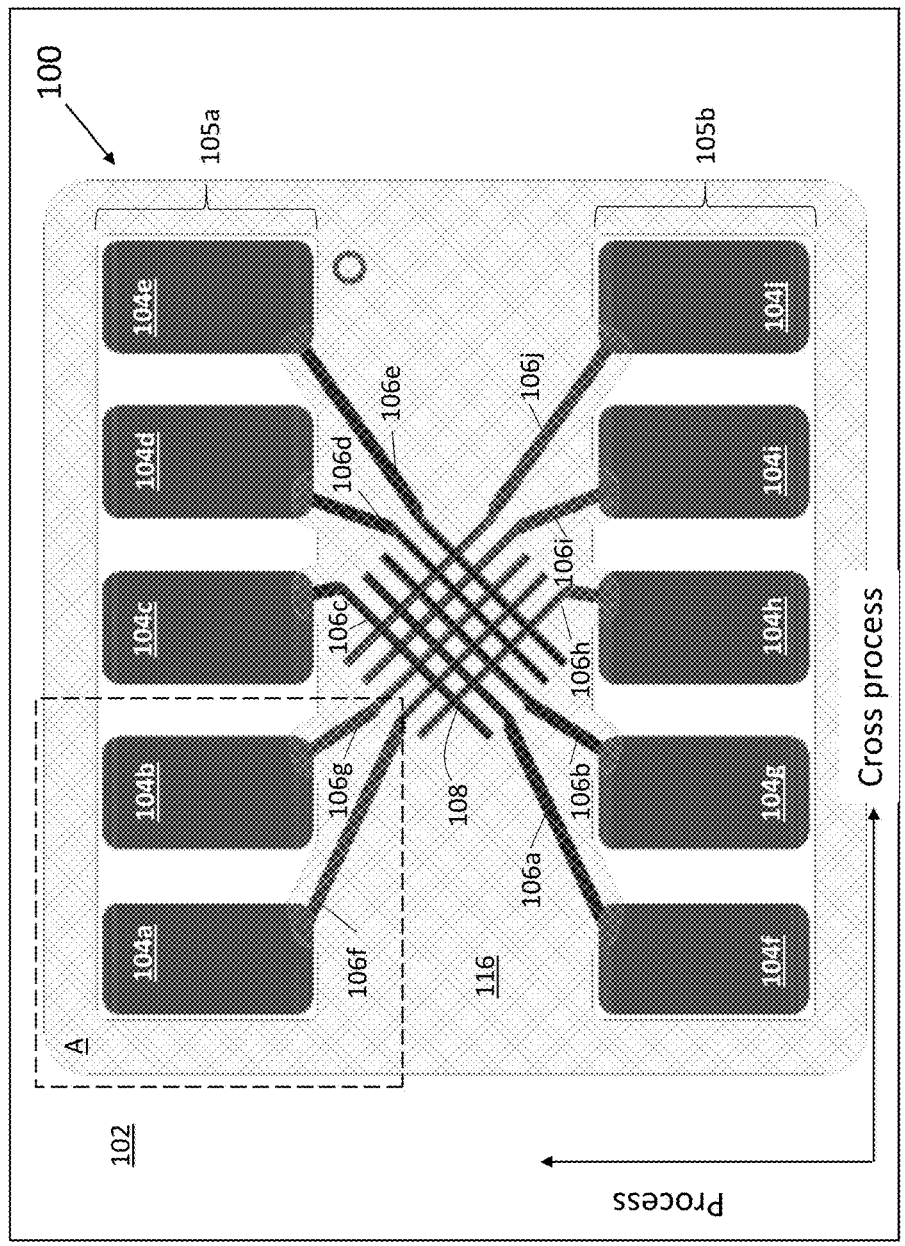
FIG. 1A depicts a top view of a coated printed electronic device according to an illustrative embodiment.

Provided are coated printed electronic devices exhibiting improved yield and methods of fabricating and using such devices.

The coated printed electronic devices are based on arrays or matrices of memory cells known as passive arrays or matrices. The devices are multilayer structures comprising stacked layers, each layer composed of a different material and/or configured in a different pattern, depending upon the function of the layer. The devices comprise a plurality of contact pads arranged in a pattern; a plurality of electrode traces arranged in another pattern, the plurality of electrode traces comprising a set of bottom electrode traces and a set of top electrode traces, each electrode trace in electrical communication with an associated contact pad of the plurality of contact pads; a plurality of memory cells, each memory cell located at an intersection of a pair of electrode traces of the plurality of electrode traces; and a protective layer covering the plurality of electrode traces. Each memory cell comprises a bottom electrode layer, a top electrode layer, and a ferroelectric layer between the top and bottom electrode layers. The top and bottom electrode layers of the memory cells correspond to regions of top and bottom electrode traces, respectively. Moving from bottom to top in the devices, the set of bottom electrode traces is one of the layers of the multilayer structure, the ferroelectric layer is a layer overlying the set of bottom electrode traces, the set of top electrode traces is a layer overlying the ferroelectric layer, the plurality of contact pads is a layer overlying the set of top electrode traces and the protective layer is a layer overlying the plurality of contact pads. The protective layer may be the topmost layer in the device.

The protective layer protects the underlying layers of the coated printed electronic devices from a variety of external forces which can damage the devices, e.g., scratches, abrasion, chemicals, etc. Conventionally, coverage of the protective layer over the underlying material layers has been maximized so as to maximize the level of protection for these underlying material layers. The present disclosure is based, in part, on the finding that the yield of coated printed electronic devices is improved (i.e., increased) when using protective layers that provide reduced coverage as compared to conventional coated printed electronic devices. This is surprising since the protective layers themselves are not the electrically active components of the printed electronic devices and so would otherwise be thought to have a minimal effect on yield. The increased yield is further described below with respect to illustrative embodiments of coated printed electronic devices (see FIGS. 1A and 3). Reduction of the coverage of the protective layer also has the advantage of reducing costs since less material is used.

In the present coated printed electronic devices, the protective layer covers the underlying plurality of electrode traces. From a top view of the device (e.g., see FIGS. 1A and 3), this means the lateral (i.e., in plane) dimensions of the protective layer at least match the lateral dimensions of each of the electrode traces of the plurality of electrode traces which underlie the protective layer. However, the protective layer also covers, i.e., extends laterally over, a region beyond edges of each electrode trace of the plurality of electrode traces. This extended region fully surrounds each electrode trace and is referred to herein as a "buffer zone." The buffer zone may be characterized by a width corresponding to the distance between an edge of a covered electrode trace to an edge of the protective layer, the width measured along an axis perpendicular to the longitudinal axis of the electrode trace. At an end of an electrode trace, the buffer zone can extend radially from each corner of the electrode trace a distance equivalent to the buffer zone width. Thus, the buffer zone effectively traces the perimeters of, and thus, surrounds, each electrode trace of the plurality of electrode traces. The buffer zone width, i.e., the amount of lateral extension beyond the edges of each electrode trace, is at least $2*\sqrt{2}*$(line registration capability). By "line registration capability" it is meant the registration error value associated with the printing apparatus used to print the protective layer. The registration error value for a printing apparatus may be provided by the manufacturer of the printing apparatus or may be determined by monitoring printed registration marks against a fixed datum to which all printed layers are registered against. At least in some lateral locations (i.e., locations within the plane of the protective layer), the buffer zone width is greater than $2*\sqrt{2}*$(line registration capability).

Because the protective layer extends laterally beyond the edges of each of the electrode traces of the plurality of electrode traces and since each electrode trace is in direct contact with an associated contact pad, a portion of each contact pad of the plurality of contact pads is also covered by the protective layer, i.e., the protective layer overlaps onto each contact pad. The region of a contact pad covered by the protective layer may be referred to herein as an overlapping region. However, in such overlapping regions, the buffer zone width is no more than $2*\sqrt{2}*$(line registration capability). That is, although the buffer zone width may be more than $2*\sqrt{2}*$(line registration capability) in some lateral locations in the protective layer, in the overlapping regions, the buffer zone width is no more than $2*\sqrt{2}*$(line registration capability). In embodiments, the buffer zone width is $2*\sqrt{2}*$(line registration capability) in the overlapping regions. In embodiments, the buffer zone width in the overlapping regions is greater than zero but no more than 500 µm; greater than zero but no more than 400 µm; or greater than zero but no more than 300 µm. In embodiments, the buffer zone width in the overlapping regions is in a range of greater than 200 µm to $2*\sqrt{2}*$(line registration capability). In embodiments, the buffer zone width in the overlapping regions is in a range of greater than 200 µm to 500 µm. This includes buffer zone widths of 250 µm, 275 µm, 300 µm, 325 µm, and 350 µm. In the design phase, distances may be calculated using CAD software. Post production, these distances may be measured with a video measurement system.

Although the protective layer overlaps a portion of each contact pad of the plurality of contact pads, each contact pad also has an uncovered portion, i.e., a portion over which the protective layer does not overlap. In embodiments, each contact pad is covered by the protective layer in an overlapping region and has a remaining portion which is uncovered, i.e., the rest of the contact pad is not covered by the protective layer. This is useful to minimize the wicking of the material of the protective layer onto the material of the contact pad.

Each contact pad of the plurality of contact pads may also have at least one edge which is uncovered by the protective layer, i.e., at least one edge which the protective layer does not contact and does not overlap. In embodiments, all edges of each contact pad are uncovered by the protective layer, except for those covered due to the buffer zone/overlapping region. In embodiments, the protective layer is further configured to define a gap between an edge of the protective layer and an adjacent, facing edge of each contact pad. The gap may be characterized by a width corresponding to the distance between the edge of the protective layer and the adjacent, facing edge of the contact pad, measured along an axis perpendicular to the edges. In embodiments, the gap width is at least $2*$(line registration capability). In embodiments, the gap width is at least 80 µm, at least 100 µm, at least 300 µm, or in the range of from 80 to 100 µm, from 200 to 500 µm or from 100 to 600 µm. This is useful to further minimize the wicking of the material of the protective layer onto the material of the contact pad.

Aside from the guidelines described above describing the lateral extension of the protective layer relative to the plurality of electrode traces and to the plurality of contact pads, the lateral extension of the protective layer in other regions may otherwise vary. This is illustrated in FIG. 1A (a protective layer defining two apertures) and FIG. 3 (a continuous protective layer having an approximately rectangular shape).

The protective layer may be provided as a single layer or multiple stacked (e.g., two) sublayers. Multiple sublayers provide a way of using different materials to achieve different functions, e.g., a first sublayer may be composed of a material capable of providing increased mechanical resistance against external forces such as scratches and abrasions (e.g., a hard coat) and a second sublayer underlying the first sublayer may be composed of a more elastic material capable of absorbing lateral dimensional changes imposed by the first sublayer. Illustrative materials are further described below.

A top view of an illustrative coated printed electronic device 100 is shown in FIG. 1A. The process and cross-process directions which define the lateral dimensions of each of the layers of the device 100 are labeled in FIG. 1A. An outline illustrating the edge of a substrate 102 upon which the layers of the device 100 is shown. However, the substrate 102 may be much larger such that many coated printed electronic devices may be printed thereon. The device 100 comprises a plurality of contact pads 104*a-j* arranged in a pattern and a plurality of electrode traces 106*a-j* arranged in another pattern. The pattern of the plurality of contact pads 104*a-j* is that of two, linear arrays 105*a, b*, extending parallel to one another and parallel to the cross-process direction. The linear arrays 105*a, b* are spaced apart in the process direction to define a space between. In this embodiment, each contact pad 104*a-j* has a rectangular shape. In the present disclosure, the term "rectangular" includes rectangles having sharp corners as well as rectangles having rounded corners such as those shown in FIG. 1A. However, other shapes may be used for the contact pads 104*a-j*. Moreover, each contact pad need not have the same shape. Contact pad shapes described in U.S. Application filed Jul. 18, 2018 for "PRINTED ELECTRONIC DEVICES EXHIBITING IMPROVED YIELD" may be used, which is hereby incorporated by reference in its entirety.

The plurality of electrode traces 106*a-j* is positioned in the space defined by the linear arrays 105*a, b*. Each electrode trace of traces 106*a-j* is in electrical communication with an associated contact pad of pads 104*a-j*, e.g., electrode trace 106*a* and contact pad 104*f* are an associated pair. The plurality of electrode traces 106*a-j* includes both top electrode traces 106*a-e* and bottom electrode traces 106*f-j*. (Both are visible because a ferroelectric layer formed between top and bottom electrode traces 106*a-e*, 106*f-j* is not shown.) Portions of both top and bottom electrode traces 106*a-e*, 106*f-j* are configured as stripes wherein the stripe portions of top electrode traces 106*a-e* are oriented parallel to each other and the stripe portions of the bottom electrode traces 106*f-j* are oriented parallel to each other and orthogonal to the top electrode traces 106*a-e*, thereby forming a grid pattern. The remaining portions of the top and bottom electrode traces 106*a-e*, 106*f-j* extend linearly to their associated contact pads. In this embodiment, the grid pattern is oriented 45° with respect to the process and cross-process directions. Although other orientations may be used, the 45° orientation is useful because it minimizes any shift in the bit's physical location and associated electrical response due to straight process or cross-process shifts in the registration of the device. When compared with a device whose matrix is arranged orthogonally with the printing direction, a matrix arranged at 45° will minimize the resultant offset in any registration error by a factor of $1/\sqrt{2}$.

As noted above, each memory cell of the plurality of memory cells is formed at an intersection of a pair of electrode traces of the plurality of electrode traces 106*a-j*. One such intersection and memory cell is labeled 108. Although not shown in FIG. 1A, the printed electronic device 100 comprises the ferroelectric layer between the top and bottom electrode traces 106*a-e*, 106*f-j*. A cross-sectional view of the memory cell 108 is illustrated in FIG. 1C, showing a top electrode layer 110, a bottom electrode layer 112, and a ferroelectric layer 114 between the top and bottom electrode layers 110, 112. The top electrode layer 110 corresponds to a region of the top electrode trace 106*c*. The bottom electrode layer 112 corresponds to a region of the bottom electrode trace 106*h* at the intersection. A portion of a protective layer 116 covers the top electrode layer 110. Turning back to FIG. 1A, the device 100 includes 25 memory cells. Due to the configuration of the plurality of electrode traces 106*a-j* (i.e., grid pattern), the plurality of memory cells is arranged as a 5×5 matrix of memory cells.

Figure 4:
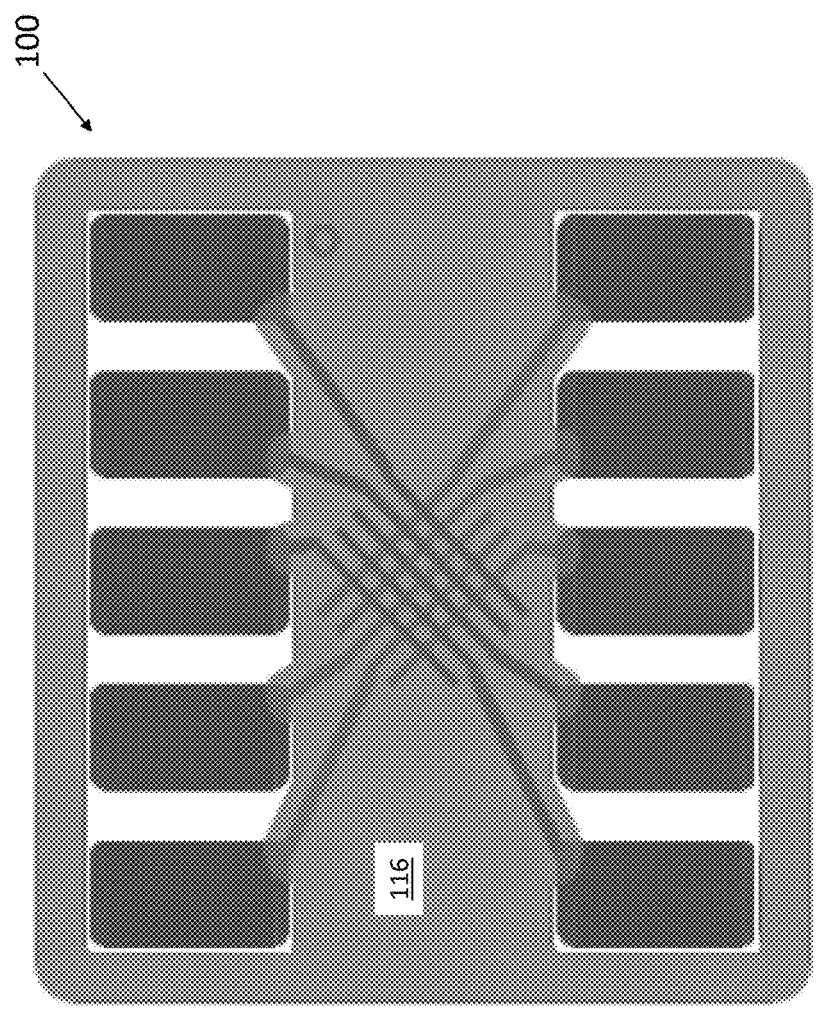
FIG. 4 depicts a top view of the coated printed electronic device of FIG. 1A, but in which the protective layer has been darkened to show its lateral dimensions more clearly.

As shown in FIG. 1A, the coated printed electronic device 100 further comprises the protective layer 116. In this embodiment, the protective layer 116 is the topmost material layer of the device 100. The protective layer 116 extends over each electrode trace of the plurality of electrode traces 106*a-j* to a region beyond each edge of each electrode trace, thereby providing a buffer zone surrounding each electrode trace. As a result, a portion of each contact pad of the plurality of contact pads 104*a-j* is also covered by the protective layer 116 in an overlapping region. As described above, in this overlapping region, the width of the buffer zone is no more than $2*\sqrt{2}*$(line registration capability). FIG. 4 depicts a top view of the coated printed electronic device of FIG. 1A, but in which the protective layer 116 has been darkened to show its lateral dimensions more clearly.

Turning to FIG. 1B, which is an expanded view of section A of FIG. 1A, white solid arrows are used to indicate the buffer zone widths in the overlapping regions of contact pad 104*a* and contact pad 104*b*. As indicated by the black solid arrows, in other regions, particularly those near, but not over, the contact pads 104*a-j*, the buffer zone width also has a similar magnitude. However, as indicated by the partial black dashed arrows, in yet other regions, particularly those closer to the memory cells the buffer zone width is significantly greater.

In the embodiment of FIG. 1A, the protective layer 116 defines two apertures 118*a, b*, each positioned over a respective one of the linear arrays 105*a, b* such that each contact pad of contact pads 104*a-j* is entirely uncovered by the protective layer 116, except for those portions covered due to the buffer zone/overlapping region. In addition, all edges of each contact pad of contact pads 104*a-j* are also uncovered by the protective layer 116, except for those covered due to the buffer zone/overlapping region. In addition, regions between adjacent contact pads are also uncovered by the protective layer 116, except for those covered due to the buffer zone. This is best shown in FIG. 1B, showing an uncovered region 117 between adjacent contact pads 104*a, b*. Finally, the protective layer 116 is further configured to define a gap between its edge (in this embodiment, an inner edge defining the apertures 118*a, b*) and an adjacent, facing edge of each contact pad. This is best shown in FIG. 1B, in which an inner edge 120 of the protective layer 116 and adjacent, facing edges 122 of contact pad 104*b* are labeled and spaced apart to define gaps (indicated by sets of bold parallel lines). Turning back to FIG. 1A, apertures 118*a, b* each have a rectangular shape, due to the rectangular shape of the linear arrays 105a, b. However, other shapes may be used, particularly if other arrangements of the contact pads 104a-j are used.

Figure 3:
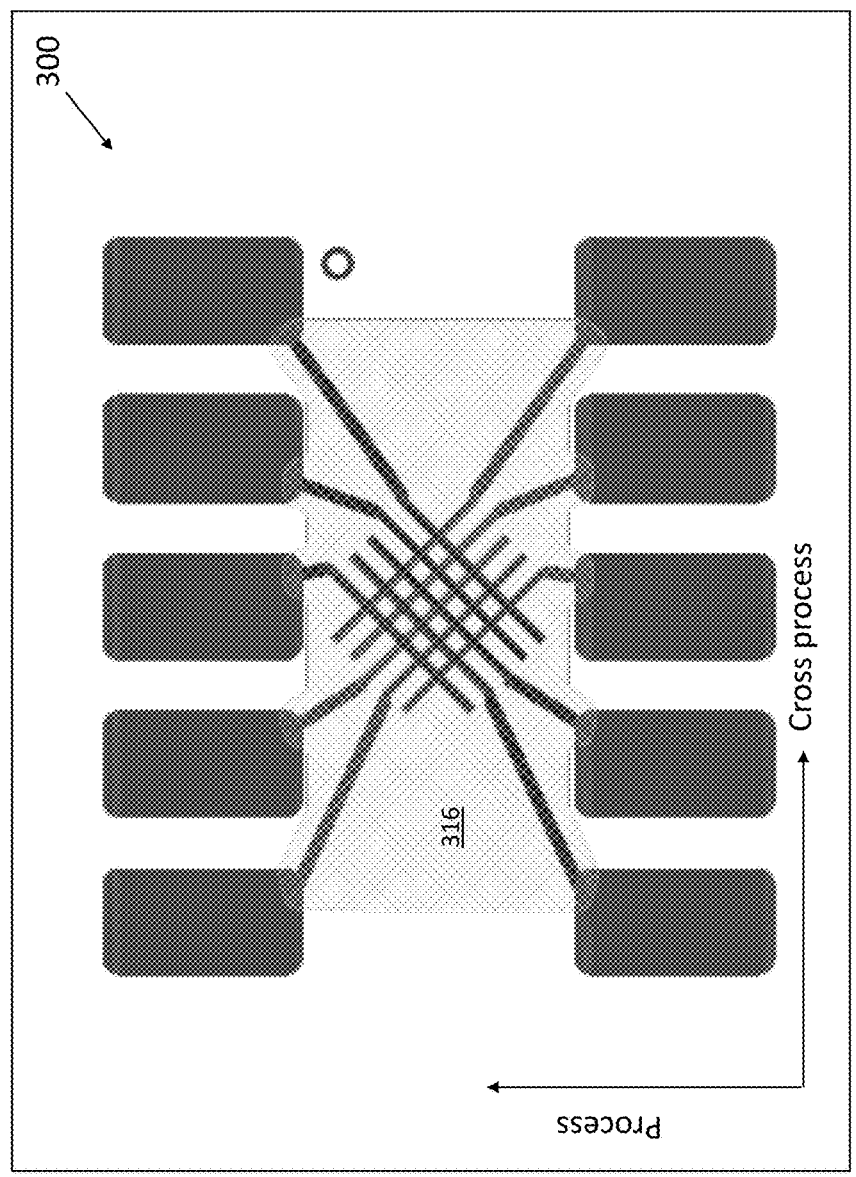
FIG. 3 depicts a top view of a coated printed electronic device according to an illustrative embodiment.
Figure 5:
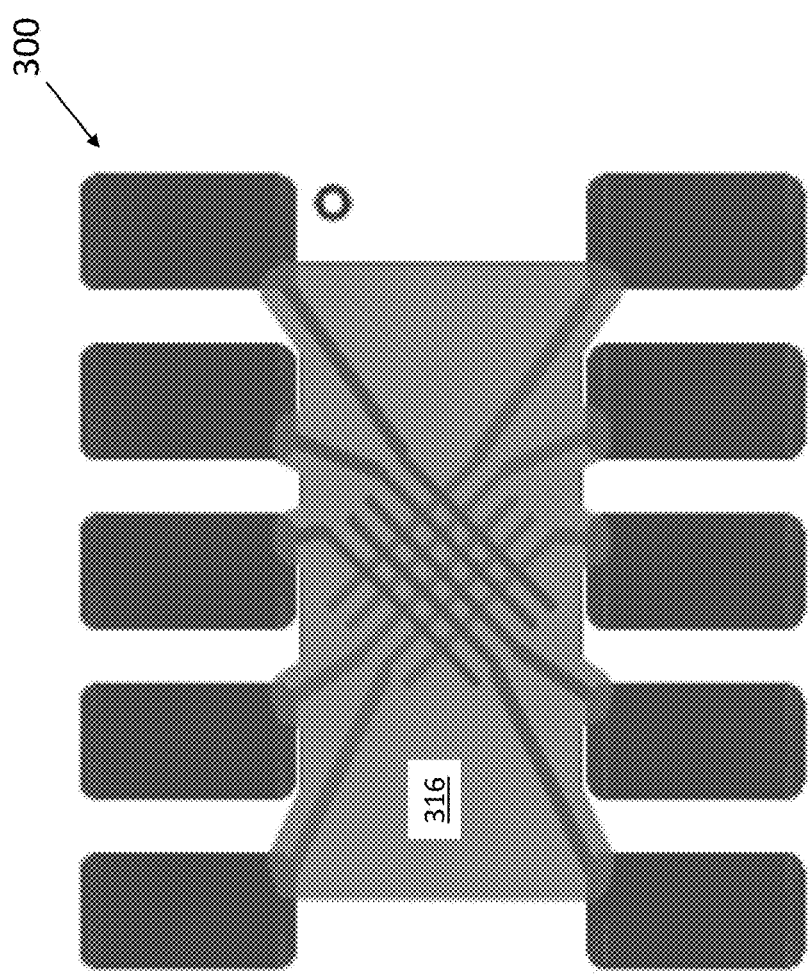
FIG. 5 depicts a top view of the coated printed electronic device of FIG. 3, but in which the protective layer has been darkened to show its lateral dimensions more clearly.

A top view of another illustrative coated printed electronic device 300 is shown in FIG. 3. The device 300 is configured identically to the device 100 of FIG. 1A, except the device 300 has an alternatively configured protective layer 316. FIG. 5 depicts a top view of the coated printed electronic device of FIG. 3, but in which the protective layer 316 has been darkened to show its lateral dimensions more clearly. In the embodiment of FIG. 3, the lateral dimensions of the protective layer 316 are further reduced to provide the layer 316 as a continuous approximately rectangular shaped region positioned over the plurality of electrode traces. The term "approximately" is used since the buffer zone surrounding each electrode trace and overlapping each contact pad means that the perimeter of the protective layer 316 deviates from that of a rectangle having straight sides. All other regions of the device 300 are uncovered by the protective layer 316. The embodiment of FIG. 3 uses even less material as compared to the embodiment of FIG. 1A, providing additional cost savings. The embodiment of FIG. 3 is particularly useful with rigid, non-flexible substrates since the protective layer 316 may put additional stress across the underlying plurality of electrode traces.

Figure 2:
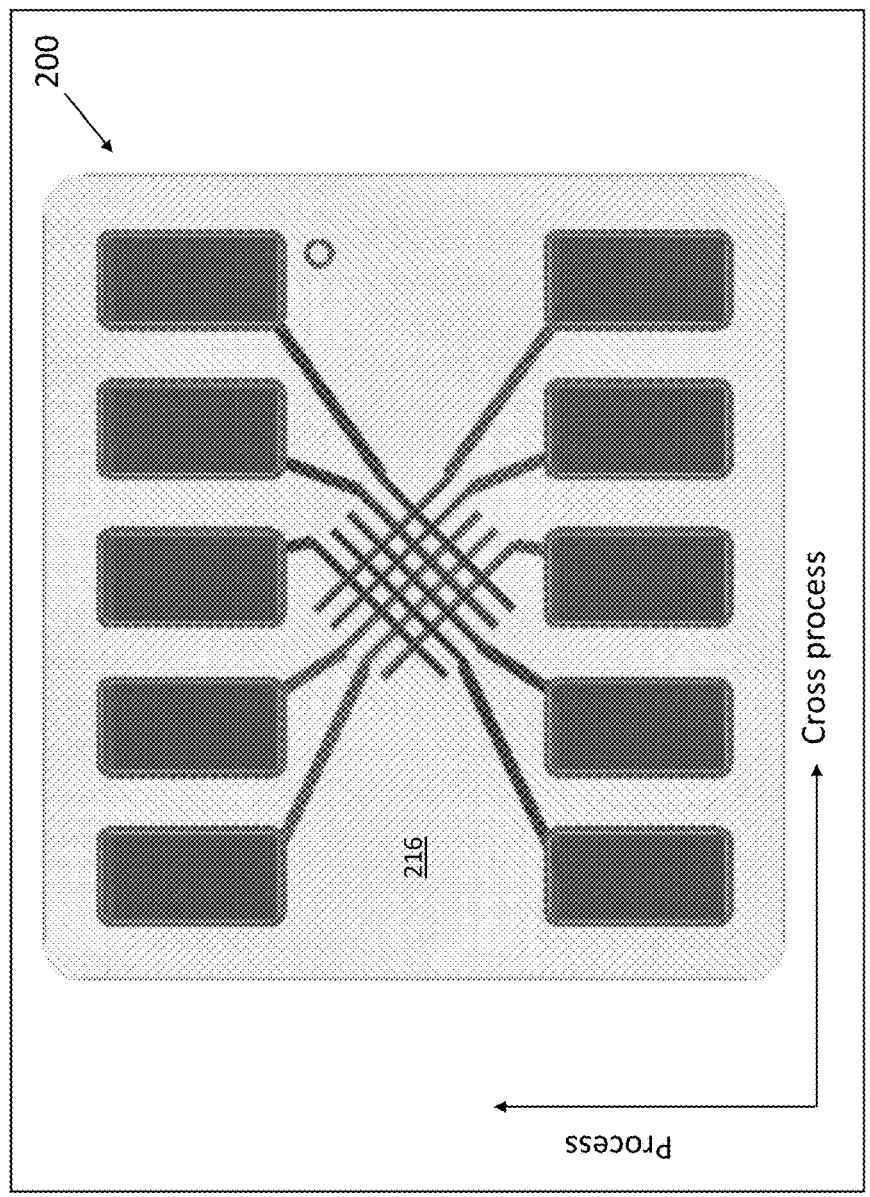
FIG. 2 depicts a top view of a comparative coated printed electronic device.

A roll of coated printed electronic devices configured as the embodiment of device 300 was fabricated according to the method described below. Specifically, a printing system comprising a printing apparatus configured to gravure print silver (for the plurality of electrode traces), a printing apparatus configured to extrusion coat a ferroelectric material (for the ferroelectric layer), a printing apparatus configured to rotary screen print carbon (for the plurality of contact pads), and a printing apparatus configured to rotary screen print a curable composition (for the protective layer) was used. A roll of comparative printed electronic devices was fabricated using the same printing system and the same method, but coverage of the protective layer was maximized as shown in device 200 of FIG. 2. In FIG. 2, the comparative printed electronic device 200 is configured identical to the device 300 of FIG. 3, except for a comparative protective layer 216. The comparative protective layer 216 covers the entire printed electronic device except for an inner region of each contact pad. In the comparative device 200, the protective layer 216 overlaps each edge of each contact pad by 200 μm.

Yields for the rolls were evaluated as follows. The two rolls were first printed in the same production campaign and evaluated prior to the application of the protective layers. These rolls were then completed using either the comparative protective layer 216 or the protective layer 316. A sample set (about 500,000 devices) from each roll was then evaluated by subtracting the chip yield as measured in the full device from the chip yield as measured prior to application of the protective layers. The full device yield decreased by 2.60% using the comparative protective layer 216. By comparison, the full device yield decreased by only 1.27% using the protective layer 316. Improvement in yield of a factor of 2 is extremely commercially significant. Yield was also evaluated for a roll of coated printed electronic devices configured as the embodiment of device 100 (protective layer 116). Results were similar to the roll of coated printed electronic devices configured as the embodiment of device 300.

As described above, contact pads arranged in linear arrays and electrode traces arranged in a grid pattern to form a matrix of memory cells may be used. However, other arrangements and patterns may be used. For example, contact pads may be arranged in circular or matrix patterns and may assume a variety of lateral positions over an underlying substrate with respect to the electrode traces and memory cells. In addition, by an appropriate configuration of electrode traces, memory cells can be arranged to form linear arrays, e.g., using a single (1) common bottom electrode and N parallel top electrodes oriented orthogonal to the bottom electrode (i.e., a 1×N linear array). The matrix arrays shown in FIGS. 1A and 3 are illustrative N×N matrix arrays, having N top electrode traces and N bottom electrode traces. However, nonequal numbers of top and bottom electrode traces may be used, e.g., M bottom electrode traces and N top electrode traces to form an M×N matrix array. In addition, as noted above, the orientation of the pattern of the plurality of electrode traces relative to the plurality of contact pads may vary. In addition, the portions of the electrode traces extending from the memory cells to their associated contact pads can assume a variety of paths.

The materials used for the various layers of the coated printed electronic device depend upon the application for the device and the particular function of each layer. Illustrative materials for the substrate include silicon, glass, polymer, paper, etc., Illustrative materials for the electrode traces/electrode layers include metals, e.g., silver, or conductive polymers, e.g., polyethylenedioxythiophene. Illustrative materials for the ferroelectric layer include ferroelectric polymers, e.g., copolymer of polyvinylidene fluoride and trifluoroethylene. Illustrative materials for a sublayer (e.g., a topmost sublayer) of the protective layer include UV curable polymeric compositions (e.g., polyesters, polyethers). Curable compositions described in U.S. Application filed Jul. 18, 2018 for "PROTECTIVE LAYERS FOR HIGH-YIELD PRINTED ELECTRONIC DEVICES," may be used, which is hereby incorporated by reference in its entirety. Illustrative materials for a sublayer (e.g., an underlying sublayer) of the protective layer include polypropylene glycol (PPG), silicon rubber, natural rubber, polyvinyl acetate and acrylate-based resins. Other layers may be included in the coated printed electronic devices, e.g., insulating layers composed of insulating polymers, e.g., acrylic-based polymers, between the substrate and bottom electrode traces, which improve planarization and promote adhesion. Other illustrative materials include those described in U.S. Pat. No. 9,412,705 and International Pat. Pub. Nos. WO 2006/135246 and WO 2006/135247, each of which is hereby incorporated by reference in its entirety.

Aside from the requirements regarding the buffer zone widths and gap widths described above, other dimensions of the features of the coated printed electronic devices, the thicknesses of the material layers, as well as the overall dimensions of the devices may be selected depending upon the function of the material layers, the application for the devices and number of memory cells.

The coated printed electronic devices may be used in a variety of applications, including product authentication applications for print cartridges, event tickets, credit cards, etc.

Methods of fabricating the disclosed coated printed electronic devices are also provided. The methods are carried out on printing systems comprising one or more printing apparatuses configured to print material layers using a thin-film printing technique, e.g., inkjet printing, screen printing, flexographic printing, offset printing, electrographic printing, gravure printing, extrusion coating, etc. Since different material layers may be printed using different techniques, the printing system can include multiple, different types of printing apparatuses. The printing apparatuses used in the printing system may be characterized by a line registration capability. The line registration capability may be at least 50 µm, at least 75 µm, at least 100 µm, at least 150 µm, at least 200 µm, at least 250 µm, or in the range of from 50 to 300 µm. The methods involve the sequential printing of the material layers of the desired printed electronic device, in a bottom-up, layer-by-layer fashion.

In embodiments, a method of fabricating a coated printed electronic device comprises printing a plurality of bottom electrode traces on a substrate; printing a layer of a ferroelectric material on the plurality of bottom electrode traces; printing a plurality of top electrode traces on the layer of the ferroelectric material, wherein the plurality of bottom and top electrode traces forms a plurality of electrode traces arranged in a pattern and defines a plurality of memory cells, each memory cell located at an intersection of a pair of electrode traces of the plurality of electrode traces; printing a plurality of contact pads on the plurality of electrode traces, wherein the plurality of contact pads are arranged in a another pattern and each electrode trace of the plurality of electrode traces is in electrical communication with an associated contact pad of the plurality of contact pads; printing a curable composition on the plurality of electrode traces and the plurality of contact pads; and curing the curable composition to provide a protective layer. In the method, the plurality of electrode traces, the plurality of contact pads, and the plurality of memory cells which are printed may be arranged in any of the corresponding patterns described above. In the method, the protective layer is configured as described above.

Curing may be carried out by exposing the curable composition to radiation under conditions to induce the free radical polymerization reactions between components of the curable composition. The curing conditions include, for example, the wavelength of the radiation, the curing temperature, the curing time (which may be adjusted by the curing speed, e.g., when the source of the radiation is scanned over the printed curable composition), and the curing atmosphere. Various wavelengths may be used. In embodiments, the wavelength is in the range of from 200 nm to 800 nm, from 250 nm to about 750 nm, or from 300 nm to 700 nm. Any light source providing wavelengths within these ranges may be used, e.g., mercury arc lamps. In embodiments, the curing temperature is room temperature, i.e., from about 20° C. to about 25° C. In embodiments, the curing time is in the range of from 1 second to 10 minutes, 1 second to 1 minute, or about 1 second. The curing may be performed in an ambient atmosphere (i.e., air at atmospheric pressure).

Methods of using a coated printed electronic device are also provided. In embodiments, such a method comprises contacting a plurality of contact pads of a coated printed electronic device with a plurality of pins of a read/write unit. This contact enables application of voltage waveforms to control the reading/writing of the plurality of memory cells and to sense the state of the memory cells during reading. Any of the coated printed electronic devices disclosed herein may be used. The configuration of the read/write unit is not particularly limited, provided the plurality of pins is arranged in a pattern corresponding to the pattern of the plurality of contact pads of the printed electronic device. Commercially available read/write units may be used.

Use of directional terms, such as top, bottom, right, left, front, back, upper, lower, etc. are merely intended to facilitate reference to various surfaces that form components of the devices referenced herein and are not intended to be limiting in any manner.

It will be appreciated that variants of the above-disclosed and other features and functions or alternatives thereof, may be combined into many other different systems or applications. Various presently unforeseen or unanticipated alternatives, modifications, variations or improvements therein may be subsequently made by those skilled in the art, which are also intended to be encompassed by the following claims.

What is claimed is:

1. A coated, printed electronic device comprising:
a plurality of contact pads arranged in a pattern,
a plurality of electrode traces arranged in another pattern, the plurality of electrode traces comprising a set of bottom electrode traces and a set of top electrode traces, each electrode trace in electrical communication with an associated contact pad of the plurality of contact pads,
a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers, and
a protective layer covering the plurality of electrode traces and extending laterally beyond each edge of each electrode trace to provide a buffer zone surrounding each electrode trace, the buffer zone extending from an end of each electrode trace to cover a portion of each associated contact pad in an overlapping region, wherein each contact pad also has at least one uncovered edge, wherein the buffer zone is characterized by a buffer zone width which is no more than $2*\sqrt{2}*$(line registration capability) in the overlapping region.

2. The device of claim 1, wherein the buffer zone width is greater than 200 µm and no more than $2*\sqrt{2}*$(line registration capability) in the overlapping region.

3. The device of claim 1, wherein the buffer zone width is greater than zero and no more than 500 µm.

4. The device of claim 1, wherein the buffer zone width is greater than 200 µm and no more than 500 µm.

5. The device of claim 1, wherein the buffer zone width is at least $2*\sqrt{2}*$(line registration capability) in regions other than the overlapping region.

6. The device of claim 1, wherein the protective layer is configured to define an aperture positioned over the plurality of contact pads.

7. The device of claim 6, wherein the buffer zone width is greater than zero and no more than 500 µm, further wherein the protective layer is configured to define a gap between an edge of the protective layer and an adjacent facing edge of each contact pad, the gap characterized by a gap width which is at least 80 µm.

8. A plurality of coated, printed electronic devices comprising a substrate and a plurality of coated, printed electronic devices on the substrate, each device configured according to the device of claim 1.

9. A coated, printed electronic device comprising:
a plurality of contact pads arranged in a pattern,
a plurality of electrode traces arranged in another pattern, the plurality of electrode traces comprising a set of bottom electrode traces and a set of top electrode traces, each electrode trace in electrical communication with an associated contact pad of the plurality of contact pads, a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers, and a protective layer covering the plurality of electrode traces and extending laterally beyond each edge of each electrode trace to provide a buffer zone surrounding each electrode trace, the buffer zone extending from an end of each electrode trace to cover a portion of each associated contact pad in an overlapping region, wherein each contact pad also has at least one uncovered edge, wherein all edges of each contact pad are uncovered except for portions of edges in the overlapping region.

10. A coated, printed electronic device comprising:
a plurality of contact pads arranged in a pattern,
a plurality of electrode traces arranged in another pattern, the plurality of electrode traces comprising a set of bottom electrode traces and a set of top electrode traces, each electrode trace in electrical communication with an associated contact pad of the plurality of contact pads, a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers, and a protective layer covering the plurality of electrode traces and extending laterally beyond each edge of each electrode trace to provide a buffer zone surrounding each electrode trace, the buffer zone extending from an end of each electrode trace to cover a portion of each associated contact pad in an overlapping region, wherein each contact pad also has at least one uncovered edge, wherein the protective layer is configured to define a gap between an edge of the protective layer and an adjacent facing edge of each contact pad, and wherein the gap is characterized by a gap width which is at least 2*(line registration capability).

11. The device of claim 10, wherein the gap is characterized by a gap width which is at least 80 µm.

12. A coated, printed electronic device comprising:
a plurality of contact pads arranged in a pattern,
a plurality of electrode traces arranged in another pattern, the plurality of electrode traces comprising a set of bottom electrode traces and a set of top electrode traces, each electrode trace in electrical communication with an associated contact pad of the plurality of contact pads, a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers, and a protective layer covering the plurality of electrode traces and extending laterally beyond each edge of each electrode trace to provide a buffer zone surrounding each electrode trace, the buffer zone extending from an end of each electrode trace to cover a portion of each associated contact pad in an overlapping region, wherein each contact pad also has at least one uncovered edge, wherein the plurality of contact pads is arranged in two arrays extending parallel to one another a defining a space therebetween, and further wherein the protective layer is configured to define two apertures, each aperture positioned over a respective one of the two arrays, and further wherein the plurality of electrode traces is arranged in a grid pattern positioned in the space.

13. The device of claim 12, wherein the buffer zone width is greater than zero and no more than 500 µm, further wherein the protective layer is configured to define a gap between an edge of the protective layer and an adjacent facing edge of each contact pad, the gap characterized by a gap width which is at least 80 µm.

14. A coated, printed electronic device comprising:
a plurality of contact pads arranged in a pattern,
a plurality of electrode traces arranged in another pattern, the plurality of electrode traces comprising a set of bottom electrode traces and a set of top electrode traces, each electrode trace in electrical communication with an associated contact pad of the plurality of contact pads, a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers, and a protective layer covering the plurality of electrode traces and extending laterally beyond each edge of each electrode trace to provide a buffer zone surrounding each electrode trace, the buffer zone extending from an end of each electrode trace to cover a portion of each associated contact pad in an overlapping region, wherein each contact pad also has at least one uncovered edge, wherein the protective layer is configured as a continuous, approximately rectangular shaped region positioned over the plurality of electrode traces, wherein the buffer zone width is greater than zero and no more than 500 µm, and wherein the plurality of contact pads is arranged in two arrays extending parallel to one another and defining a space therebetween, and further wherein the plurality of electrode traces is arranged in a grid pattern positioned in the space.

15. A method of fabricating a coated, printed electronic device, the method comprising:
printing a plurality of bottom electrode traces on a substrate;
printing a layer of a ferroelectric material on the plurality of bottom electrode traces;
printing a plurality of top electrode traces on the layer of the ferroelectric material, wherein the plurality of bottom and top electrode traces forms a plurality of electrode traces arranged in a pattern and defines a plurality of memory cells, each memory cell located at an intersection of a pair of electrode traces of the plurality of electrode traces;

printing a plurality of contact pads on the plurality of electrode traces, wherein the plurality of contact pads is arranged in another pattern and each electrode trace of the plurality of electrode traces is in electrical communication with an associated contact pad of the plurality of contact pads;

printing a curable composition on the plurality of electrode traces and the plurality of contact pads; and curing the curable composition to form a protective layer, wherein the protective layer covers the plurality of electrode traces and extends laterally beyond each edge of each electrode trace to provide a buffer zone surrounding each electrode trace, the buffer zone extending from an end of each electrode trace to cover a portion of each associated contact pad in an overlapping region, wherein each contact pad also has at least one uncovered edge, and wherein all edges of each contact pad are uncovered except for portions of edges in the overlapping region.

16. The method of claim 15, wherein the buffer zone is characterized by a buffer zone width which is no more than $2*\sqrt{2}*$(line registration capability) in the overlapping region.

17. A method of using a coated, printed electronic device, the method comprising contacting a plurality of contact pads of a coated, printed electronic device with a plurality of pins of a read/write unit, the device comprising the plurality of contact pads arranged in a pattern, a plurality of electrode traces arranged in another pattern, the plurality of electrode traces comprising a set of bottom electrode traces and a set of top electrode traces, each electrode trace in electrical communication with an associated contact pad of the plurality of contact pads, a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers, and a protective layer covering the plurality of electrode traces and extending laterally beyond each edge of each electrode trace to provide a buffer zone surrounding each electrode trace, the buffer zone extending from an end of each electrode trace to cover a portion of each associated contact pad in an overlapping region, wherein each contact pad also has at least one uncovered edge, and wherein all edges of each contact pad are uncovered except for portions of edges in the overlapping region.

18. The method of claim 17, wherein the buffer zone is characterized by a buffer zone width which is no more than $2*\sqrt{2}*$(line registration capability) in the overlapping region.

* * * * *